(12) United States Patent
Bartlau et al.

(10) Patent No.: US 8,568,959 B2
(45) Date of Patent: Oct. 29, 2013

(54) TECHNIQUES FOR REDUCING DEGRADATION AND/OR MODIFYING FEATURE SIZE OF PHOTOMASKS

(75) Inventors: Peter H. Bartlau, Westford, VT (US); Thomas B. Faure, Milton, VT (US); Alfred Wagner, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 882 days.

(21) Appl. No.: 12/244,903

(22) Filed: Oct. 3, 2008

(65) Prior Publication Data
US 2010/0086876 A1    Apr. 8, 2010

(51) Int. Cl.
*G03F 7/20* (2006.01)

(52) U.S. Cl.
USPC .......................................................... 430/311

(58) Field of Classification Search
USPC ........................ 430/5, 311, 322, 30
See application file for complete search history.

(56) References Cited

U.S. PATENT DOCUMENTS

| | | | |
|---|---|---|---|
| 5,499,076 A * | 3/1996 | Muraki ............................ | 355/53 |
| 6,780,781 B2 * | 8/2004 | Odaka et al. .................... | 438/717 |
| 2006/0066824 A1 * | 3/2006 | Knappe et al. .................. | 355/30 |
| 2006/0215137 A1 * | 9/2006 | Hasegawa et al. ............... | 355/53 |
| 2008/0248404 A1 * | 10/2008 | Chen et al. ....................... | 430/5 |
| 2008/0251100 A1 * | 10/2008 | Shimada et al. ................... | 134/1 |
| 2009/0004077 A1 * | 1/2009 | Frisa et al. ...................... | 422/300 |
| 2009/0278233 A1 * | 11/2009 | Pinnington et al. ............ | 257/615 |
| 2010/0025858 A1 * | 2/2010 | Weiss et al. .................... | 257/774 |

FOREIGN PATENT DOCUMENTS

| CN | 101046626 A | 10/2007 |
|---|---|---|
| JP | 2001293443 A | 10/2001 |

OTHER PUBLICATIONS

Gordon et al., Influence of Environmental Components on Haze Growth, Proc. of SPIE vol. 6607, 660707, (2007).
Tchikoulaeva et al., ACLV Degradation: Root Cause Analysis and Effective Monitoring Strategy, Proc. of SPIE vol. 7028, 702816, (2008).
Gordon et al., Study of Time Dependent 193 nm Reticle Haze, Proc. of SPIE vol. 6730, 67301E, (2007).

* cited by examiner

*Primary Examiner* — Brittany Raymond
(74) *Attorney, Agent, or Firm* — Daniel P. Morris; Ryan, Mason & Lewis, LLP

(57) ABSTRACT

A photomask includes a light transmitting substrate and an absorber layer adjacent thereto. The absorber layer includes a silicide, such as molybdenum silicide, patterned into a plurality of features. The surrounding environment is controlled to prevent undesirable growth by oxidation of the absorber layer when the mask is exposed to light while being used to fabricate integrated circuits. In another aspect, the surrounding environment is controlled to encourage desirable growth by oxidation of the absorber layer when the mask is exposed to light.

24 Claims, 7 Drawing Sheets

TECHNIQUES FOR REDUCING DEGRADATION AND/OR MODIFYING FEATURE SIZE OF PHOTOMASKS

FIELD OF THE INVENTION

The present invention generally relates to the electrical and electronic arts and, more particularly, to fabrication of integrated circuits.

BACKGROUND OF THE INVENTION

A photomask is an opaque plate with holes or transparencies that allow light to shine through in a defined pattern. Lithographic photomasks are typically transparent fused silica blanks covered with a pattern defined with a chrome metal absorbing film. Photomasks are used, for example, at wavelengths of 365 nm, 248 nm, and 193 nm. A set of photomasks, each defining a pattern layer in integrated circuit fabrication, is fed into a photolithography stepper or scanner and individually selected for exposure.

Degradation of photomasks may occur under some circumstances. Furthermore, photomasks are often rejected after fabrication due to inadvertent errors in the size of one or more features.

SUMMARY OF THE INVENTION

Principles of the present invention provide techniques for reducing degradation of photomasks during operation and/or modifying feature size of photomasks. An exemplary method, according to an aspect of the invention, includes the step of obtaining a photomask comprising a light transmitting substrate and an absorber layer adjacent thereto. The absorber layer comprises a silicide, such as molybdenum silicide, patterned into a plurality of features. Additional steps include mounting the photomask into a stepper apparatus for use in an integrated circuit fabrication process; and, during the integrated circuit fabrication process, irradiating the photomask with radiation of less than about 240 nm in wavelength in an atmosphere comprising a substantially dry inert gas. Thus, growth of the absorber layer by oxidation is substantially inhibited.

In another aspect, an exemplary method includes obtaining a photomask comprising a light transmitting substrate and an absorber layer adjacent thereto. The absorber layer comprises a silicide, such as molybdenum silicide, patterned into a plurality of features. Additional steps include mounting the photomask into a stepper apparatus for use in an integrated circuit fabrication process; and, during the integrated circuit fabrication process, irradiating the photomask with radiation of less than about 240 nm in wavelength in a vacuum environment. Thus, growth of the absorber layer by oxidation is substantially inhibited.

In still another aspect of the invention, an exemplary method includes obtaining a photomask for use in an integrated circuit fabrication process. The photomask comprises a light transmitting substrate and an absorber layer adjacent thereto. The absorber layer comprises a silicide, such as molybdenum silicide, patterned into a plurality of features. The photomask has a required lifetime. An additional step includes taking into account an effect of ambient humidity on oxidation of the absorber layer during the integrated circuit fabrication process over the required lifetime, to obtain a humidity value consistent with the required lifetime. Further steps include mounting the photomask into a stepper apparatus for use in the integrated circuit fabrication process; and, during the integrated circuit fabrication process, irradiating the photomask with radiation of less than about 240 nm in wavelength in an environment consistent with the humidity value. Thus, growth of the absorber layer by oxidation is substantially inhibited to aid in achieving the required lifetime.

In yet another aspect of the invention, an exemplary method includes determining that, for a photomask comprising a light transmitting substrate and an absorber layer adjacent thereto (the absorber layer comprises a silicide (such as molybdenum silicide) patterned into a plurality of features), it is desirable to cause growth of the absorber layer to change a size of at least one of the plurality of features. An additional step includes, responsive to the determining, irradiating at least a portion of the photomask adjacent the at least one of the plurality of features with radiation of less than about 240 nm in wavelength in the presence of an oxidizing environment, to cause the growth of the absorber layer with concomitant change of the size of the at least one of the plurality of features.

One or more embodiments of methods in accordance with aspects of the invention can be, at least in part, computer implemented (for example, a computer can be used to control an environmental control system to maintain appropriate humidity).

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

Figure 1:
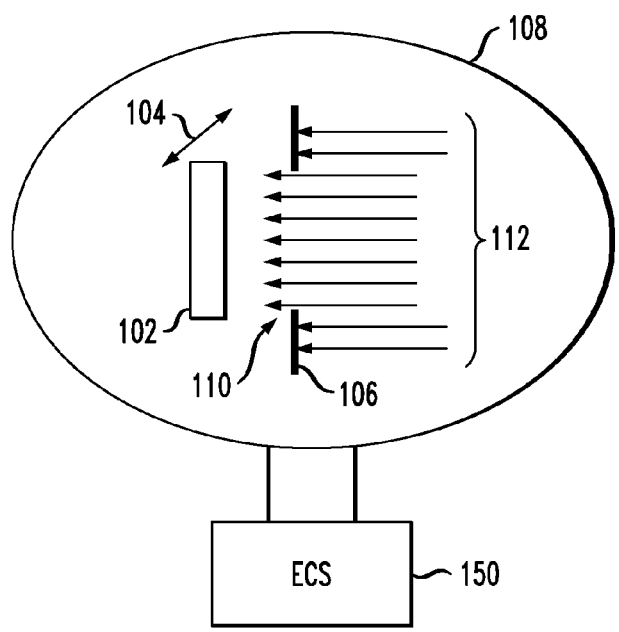
FIG. 1 shows a photomask in a lithography tool with appropriate environmental control, according to an aspect of the invention.

Aspects of the invention enhance dimensional stability and/or provide control of feature size on a photomask used in the fabrication of integrated circuits. In one or more embodiments, a method is provided for reducing or eliminating the degradation of molybdenum silicide photomasks during use in a lithography stepper. Furthermore, in one or more embodiments, a method is provided for intentionally modifying the size of features on a molybdenum silicide photomask to achieve a desired target size.

The degradation of photomasks during use in a 193 nm lithography stepper has been cited in several recent publications, namely, A. Tchikoulaeva, et al., "ACLV Degradation: Root Cause Analysis and Effective Monitoring Strategy," SPIE, Vol. 7028, pp. 702816-702816-10, 2008; Gordon et al., "Influence of Environmental Components on Haze Growth," Proc. SPIE, 2007, Vol. 6607; and Joseph Gordon, Larry Frisa, Christian Chovino, David Chan, John Keagy, Colleen Weins, "Study of Time Dependent 193 nm Reticle Haze"; SPIE Vol. 6730 (2007).

Aspects of the invention address prevention of a new type of degradation in molybdenum silicide photomasks caused by oxidation of the absorber. In this type of degradation, the oxidation causes growth of the absorber, thereby changing the size of the features on the photomask during use in a lithography tool. The oxidation has been traced to exposure to 193 nm light in the presence of water vapor. By reducing or eliminating the presence of water vapor, the change in feature size is reduced or eliminated.

In addition, aspects of the invention control growth by adjusting the water vapor concentration and the amount of exposure to 193 nm light, thus providing a method of intentionally changing the size of features on a photomask, either locally by directing a 193 nm beam of light to a specific location, or globally by directing the light across the entire photomask. Since photomasks are often rejected after fabrication due to inadvertent errors in the size of features, this exemplary method provides an approach to correct these errors and reclaim the photomask.

It should be noted that, in general terms applicable to one or more embodiments of the invention, the oxidation (growth) that occurs in a lithography tool will only occur at wavelengths less than about 240 nm because oxidizing photoproducts are only produced by light with a wavelength less than about 240 nm. Since current lithography tools typically operate at 248 and 193 nm, degradation of molybdenum silicide (or similar) photomasks will likely only occur in a 193 nm stepper. The wavelength range in such a stepper is 193.37 nm plus or minus about 10 pm (picometers); but the problem can occur for any wavelength less than about 240 nm. Similarly, intentional growth (oxidation) to adjust feature size will occur at any wavelength less than 240 nm, but wavelengths around 193 nm+/−5 nm are most desirable since they are easy to achieve and produce numerous oxidizing species in the presence of water vapor and oxygen.

Photomasks can, as noted, undergo degradation during use in the manufacture of semiconductor integrated circuits. As shown in FIG. 1, a photomask 102 in an optical lithography tool (depiction of tool limited to schematic representation of scanning stage 104 discussed below, for purposes of clarity and brevity) is exposed to a beam of light 112. The spatial extent of the light beam 112 is defined by a slit 110 in a member 106. The photomask 102 is mounted on the aforementioned scanning stage of the lithography tool; the scanning stage is schematically depicted as double-headed arrow 104. This arrangement allows the beam of light 112 to uniformly illuminate the photomask 102. The photomask 102, scanning stage 104, and so on are contained within a chamber 108 in turn containing, for example, air at atmospheric pressure. Appropriate environmental control for chamber 108 is provided by environmental control system (ECS) 150. The skilled artisan, given the teachings herein, can adapt a commercially available ECS to provide the desired conditions.

As discussed herein, reduction in undesirable growth of the absorber layer can be obtained via humidity control; further reduction in growth of the absorber layer can be achieved by eliminating oxygen, in addition to water vapor, from the ambient surrounding the photomask. This can be achieved, for example, by immersing the photomask in an inert gas environment, for example dry helium, neon, argon or nitrogen, or by immersing the photomask in vacuum.

Two types of degradation have been described in the literature, in which the degradation occurs during exposure in a lithography tool. In one case, the optically-absorbing chromium film on a chrome-on-glass photomask undergoes migration when exposed to 193 nm light during use in the lithography tool, as described in the above-mentioned Tchikoulaeva et al. reference. In the other case, a hazy film of ammonium sulfate can form on the surfaces of a photomask during exposure to 193 nm light if contaminants are present on the photomask or within the chamber, as described in the above-mentioned two Gordon et al. references.

Aspects of the invention address a new type of degradation which occurs to molybdenum silicide photomasks. As used herein, the term "silicide" is employed to include all types of masks which contain silicon, nitrogen, oxygen, and one or more metals in various concentrations. As used herein, the term "molybdenum silicide" is employed to include all types of masks which contain silicon, nitrogen, oxygen, and molybdenum in various concentrations. In this case, growth of the molybdenum silicide absorber occurs during exposure to 193 nm light, particularly in the presence of water vapor. This growth results in a change in the size of the features on the molybdenum silicide photomask during use. This unintended change in feature size is typically unacceptable. Standard cleaning processes have not been successful in removing this growth, and thus photomasks which experience this problem must be discarded and replaced with a new photomask.

Figure 2:
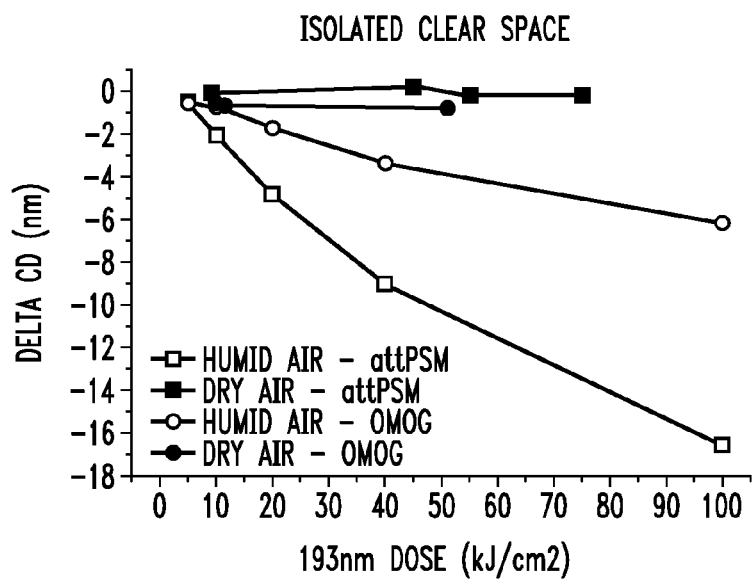
FIGS. 2 and 3 show measured changes in features of molybdenum silicide photomasks due to exposure to 193 nm light in dry and moist air.
Figure 3:
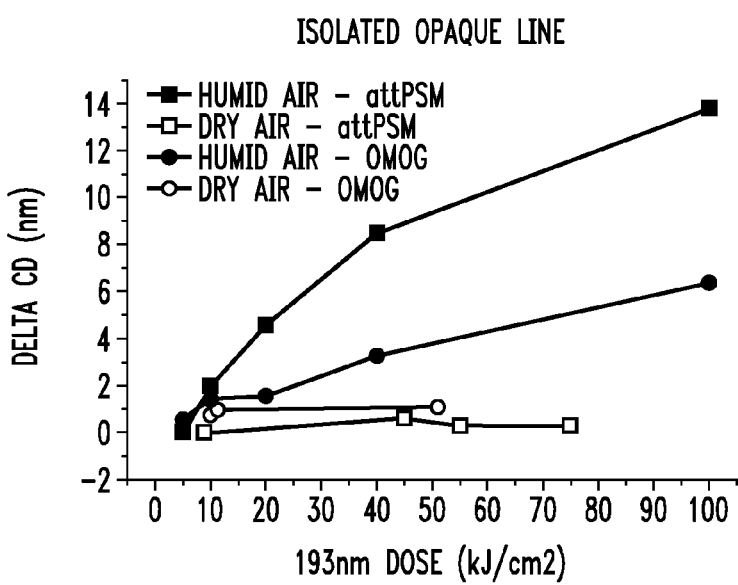

FIGS. 2 and 3 show the measured experimental change in the size of isolated 400 nm clear spaces (FIG. 2) and lines (FIG. 3) due to 193 nm irradiation. Irradiations in dry air (filled data points in FIG. 2 and open data points in FIG. 3) produced little or no change in feature size. However, irradiations in humid air (open data points in FIG. 2 and closed data points in FIG. 3) resulted in a large change in feature size, which increases with further exposure to 193 nm light. Two types of molybdenum silicide photomasks were tested. The 6% attenuated molybdenum silicide material (attPSM) (squares) showed a much larger change (~2.5×) due to humid air irradiations than the opaque binary molybdenum silicide (OMOG) (circles). This change in feature size was characterized by observation in a transmission electron microscope (TEM).

Figure 4:
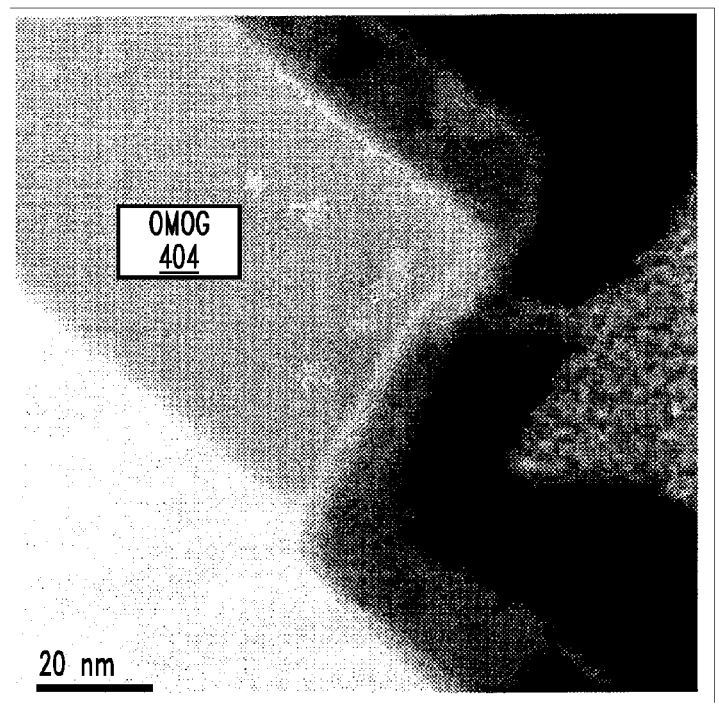
FIGS. 4 and 5 compare oxidation in a molybdenum silicide due to exposure to 193 nm light in dry and moist air.
Figure 5:
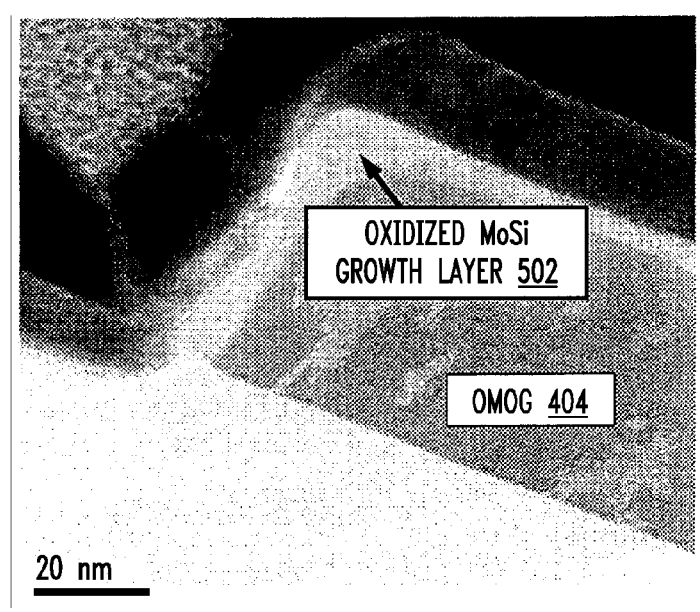

FIG. 4 shows transmission electron micrograph cross sections of irradiated opaque binary molybdenum silicide (OMOG) 404. OMOG irradiated to 100 kilojoules per square centimeter ($kJ/cm^2$) in dry air, as in FIG. 4, shows no growth or change in feature size, while the irradiations in humid air, as in FIG. 5, show significant growth of a layer 502 of oxidized molybdenum silicide resulting in an increase in feature size. Thus, by substantially reducing or eliminating water vapor from the lithography tool environment in FIG. 1, this change in feature size can be eliminated. ECS 150 maintains the desired humidity conditions in chamber 108; for example, by reducing humidity that is too high. The sections below entitled Predictive Equations and Associated Parameters and Selection of Appropriate Humidity Values present exemplary techniques for determining appropriate values of various parameters, such as humidity.

In certain cases, it may be desirable to intentionally change the size of features on a molybdenum silicide photomask. For example, if the average feature size on the photomask is incorrect after fabrication, normally the mask would have to be discarded. By intentionally oxidizing the molybdenum silicide on the fabricated mask, the average feature size can be altered to bring the photomask into specification. Another exemplary use is selective alteration of the size of features in specific regions of the photomask; for example to tune the performance of a specific chip or circuit on the photomask by selectively altering feature sizes. By directing the laser beam at specific regions of the photomask pattern, the feature size in selected areas of the photomask can be altered.

Figure 6:
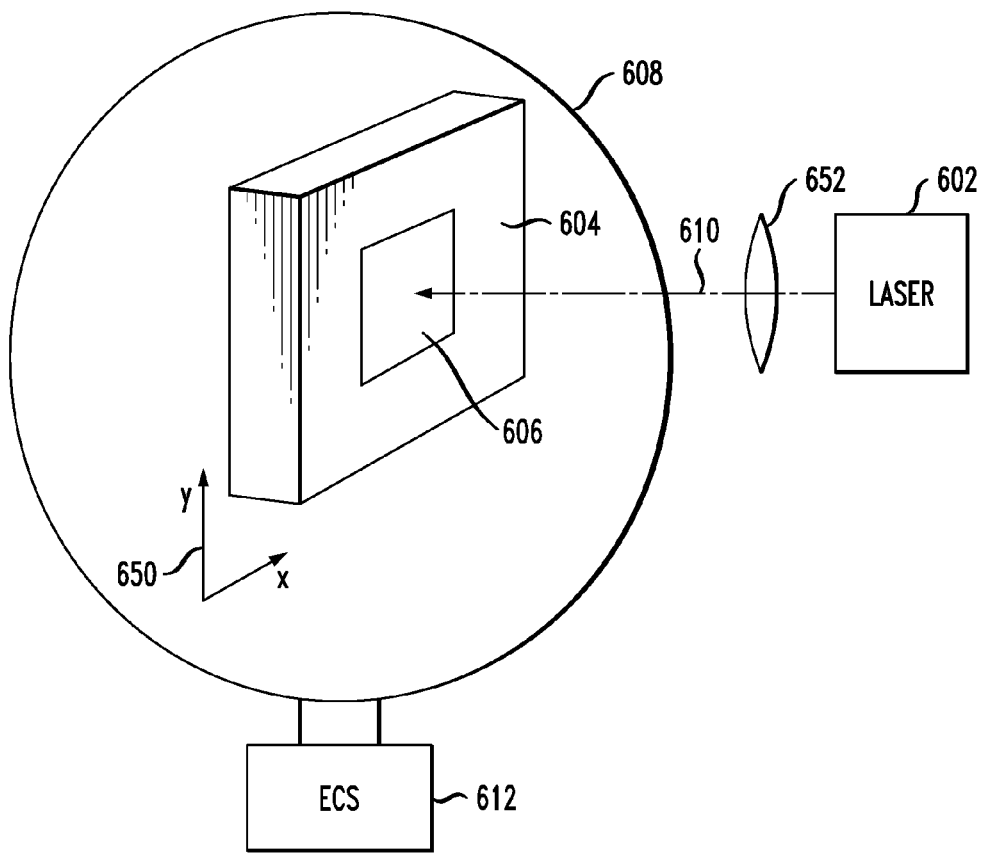
FIG. 6 shows a system for intentionally modifying a photomask.

In another aspect, the growth rate of the features increases as the square root of the 193 nm light exposure dose. This is discussed further below, and equations and associated techniques are presented. Thus, in one or more embodiments, the magnitude of the change in feature size can be precisely controlled and predicted by adjusting the exposure dose. Similarly, the growth rate depends on the water vapor concentration, allowing another degree of control on altering feature size. FIG. 6 shows a system for intentionally altering the feature size by inducing growth. A beam 610 of 193 nm light from a laser source 602 is focused onto and scanned across the photomask 604. The scanned region is designated as 606. The photomask 604 is contained in a chamber 608 in which the environment can be controlled with environmental control system (ECS) 612; for example, controlling the pressure, humidity, oxygen concentration, and the like. The skilled artisan, given the teachings herein, can adapt a commercially available ECS to provide the desired conditions. Using this system, growth of the molybdenum silicide material will occur only in the scanned area 606 and thus the size of features in various regions of the mask can be altered to the desired values. Optical system 652 may focus and direct beam 610. X-Y stage 650 may move mask 604 so that beam 610 falls where desired. In some instances, when it is desired to irradiate just a portion 606 of mask 604, stage 650 performs a rough positioning and then the beam 610 is directed over a relatively short distance (for example, by optical system 652) to provide the final adjustment to ensure irradiation of the desired portion 606.

An apparatus for growing, such as in FIG. 6, may be different than a lithography tool. For example, a lithography tool may use a line narrowed laser while an apparatus for growing may use a high dose laser and/or a laser that is not line narrowed (a broadband laser). Further, a stepper typically just scans a line whereas an apparatus for growing may illuminate a portion, or all, of the surface of the mask simultaneously. For localized growth, focus beam 610 to a spot and direct at a particular area 606. Mask 604 on stage 650 moves to a programmed position; focus beam 610 to spot 606. The beam 610 may be incident for a time determined by light intensity and integrating over time to achieve the required light dose from the equation; growth is proportional to the square root of the total photon dose (which is analogous to time at a constant incident power).

Thus, by way of review, photomasks for 32 nm lithography will typically be exposed to large doses of 193 nm photons during use in the fabrication of circuits. For high volume parts, the exposure dose can easily exceed hundreds of $kJ/cm^2$. Furthermore, each 193 nm photon carries sufficient energy to directly break bonds in most materials, potentially resulting in color center formation, material degradation, and photochemical reactions in the gaseous species surrounding the mask. As a result, radiation damage to photomask materials is a potential concern. Certain aspects of the invention address radiation damage, such as changes in critical dimensions induced by irradiation with 193 nm light.

In an experiment, a 6% MoSi attenuated phase shift mask and an opaque binary MoSi mask (OMOG) were irradiated with 193 nm light at up to 100 $kJ/cm^2$. The masks were held in a chamber containing either ultra clean extreme dry air (less than 1 ppm $H_2O$) or ultra clean air at a relative humidity of approximately 20% during the irradiation. Irradiations were performed using a line narrowed ArF excimer laser operating at 1000 Hz. The laser spot at the mask was approximately 2×7 mm in size, and each pulse was approximately 1 mJ. Note that the energy density per pulse in the test facility was several orders of magnitude greater than a typical stepper. While allowing accelerated testing, this large dose rate may affect the cumulative radiation damage. The laser beam was rapidly scanned over individual "chiplets," varying the total exposure dose at each chiplet. Approximately 25 sites (chiplets) on each mask were irradiated, out of a total of 121 sites. Both isolated 400 nm lines and isolated 400 spaces in X and Y orientations were measured at all 121 sites.

The change in CD (CD is the size of the important features on a photomask, typically referred to as "critical dimension") resulting from the irradiation is shown in FIGS. 2 and 3 as discussed above. Irradiation of either 6% attenuated MoSi or opaque MoSi (OMOG) in extreme dry air resulted in little or no change in CD for either the lines or spaces. However, irradiation in humid air resulted in a significant decrease in the size of isolated spaces, and a corresponding increase in the size of isolated lines. This indicates material growth induced by the irradiation. Notice that OMOG was much less susceptible to irradiation induced growth than the attPSM material; the attPSM growth was approximately 2 to 2.5 times greater than the OMOG growth under identical conditions. Thus, by way of review, FIG. 2 depicts CD change of isolated 400 nm clear spaces and FIG. 3 depicts CD change of isolated 400 nm lines due to 193 nm irradiation. Irradiations in dry air (filled data points in FIG. 2, open data points in FIG. 3) produced little or no change in CD. Irradiations in humid air (open data points in FIG. 2, closed data points in FIG. 3) resulted in a large change in CD which increases with 193 nm dose. The 6% attenuated MoSi material (squares) shows a much larger CD change (~2.5×) due to humid air irradiations than the opaque binary MoSi (OMOG) (circles), indicating OMOG has superior radiation damage resistance. Note, only the X CD change is plotted for clarity; the measured Y CD changes were nearly identical.

The nature of the irradiation induced growth was further investigated by performing cross sectional TEMs of the irradiated masks, as discussed with regard to FIGS. 4 and 5, which, by way of review, show TEM cross sections of OMOG irradiated to 100 $kJ/cm^2$ in extreme dry air and 20% humid air respectively. Note the bright layer 502 which is evident in FIG. 5 indicating growth of material (an oxidized MoSi layer). No growth layer is seen in FIG. 4, the dry air irradiation. Unlike the "haze" defects reported in the literature, the radiation induced growth seen here was not removed with standard mask cleaning chemistries such as SC-1 or sulfuric/peroxide. This result is consistent with material growth due to oxidation of the MoSi. During 193 nm irradiation in humid air, highly reactive species such as O, OH, and $H_2O_2$ will be produced due to photochemistry of the $H_2O$. These species are all strong oxidizers and are believed to be quite capable of oxidizing the MoSi. The formation of these species relies on the presence of water vapor, and hence in dry air these species are not present. While irradiation in dry air will produce reactive species such as ozone, they are much weaker oxidizers. In addition, the use of a line narrowed laser (mimicking the conditions in the stepper), greatly reduces the concentration of ozone. Both of these factors contribute to a reduction in irradiation induced growth in dry air versus humid air.

By way of clarification, while such use of a line narrowed laser by itself is beneficial, a reduction or elimination of oxygen from the ambient surrounding the photomask will further reduce oxidation and growth, and hence is desirable. Irradiation with light in the presence of water vapor typically produces the most reactive species, and therefore, the biggest effect—the largest amount of growth. However, even absent water vapor, ozone will be produced, though it is a weaker oxidizer that hydrogen peroxide. Therefore, it (ozone) is capable of producing a small amount of growth. Furthermore, in steppers, a line-narrowed laser, with limited frequency range, is tuned to reduce the amount of absorption (in turn reducing ozone). Both these factors reduce ozone's contribution to growth. However, eliminating oxygen will eliminate the issue completely. Thus, while a line narrowed laser is beneficial, use of a line narrowed laser with little or no oxygen is even better. It is believed that even when there is less than 1 PPM water vapor, some oxidation still occurs due to ozone production, with growth in the absorber layer even far from the laser spot, due to the ozone. Thus, to reiterate, even with a line narrowed laser, there is still some ozone, causing growth, and therefore use of a line narrowed laser plus reducing or eliminating oxygen is even better. Of course, this discussion applies to the case where it is desired to prevent oxidation of the absorber layer.

FIGS. 2-5 are intended to be non-limiting illustrations of pertinent principles applicable to one or more embodiments of the invention, and exemplary values of various parameters therein are not intended to limit the scope of the invention.

Aspects of the invention thus provide a new method of altering the size of features on a fully fabricated molybdenum silicide photomask, and/or preserving those feature sizes as the photomask is used in a lithography tool.

Predictive Equations and Associated Parameters

We have found that the growth of the molybdenum silicide absorber exhibits a predictable behavior, and follows the equation:

$$G = K \cdot \sqrt{D} \quad (1)$$

where:
G=the increase in feature size due to growth (for example, in nm),
K is a constant dependent on the absorber material and gas composition, and
D is the total exposure dose in kJ per cm².

Figure 8:
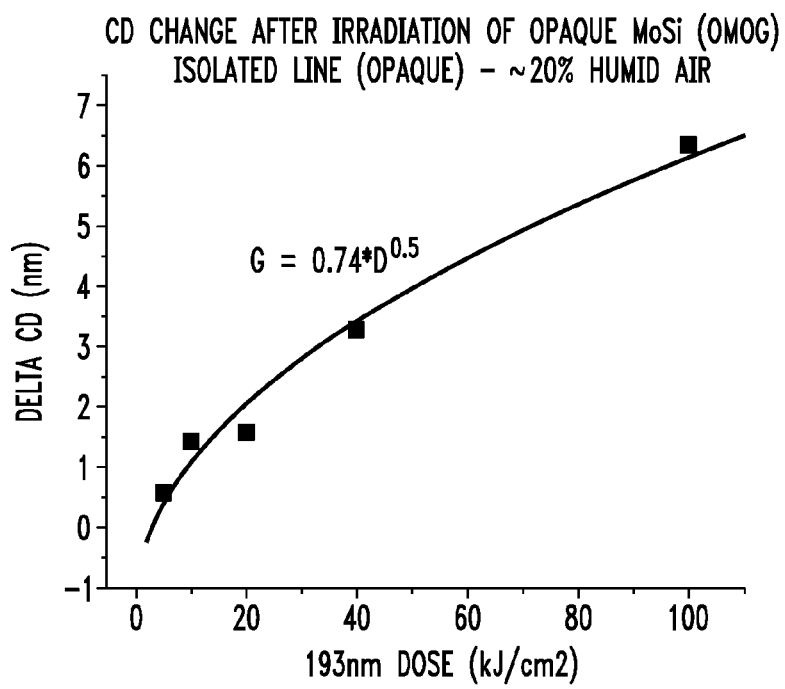
FIG. 8 shows exemplary growth versus exposure dose for an OMOG molybdenum silicide absorber.

For the OMOG molybdenum silicide absorber in air at standard temperature and pressure and a relative humidity of approximately 20%, we have found that K is approximately 0.74 as shown in FIG. 8. FIG. 8 depicts growth versus exposure dose for OMOG molybdenum silicide absorber. The squares are the measured data, and the line is a least squares fit following the functional dependence of equation 1.

Figure 9:
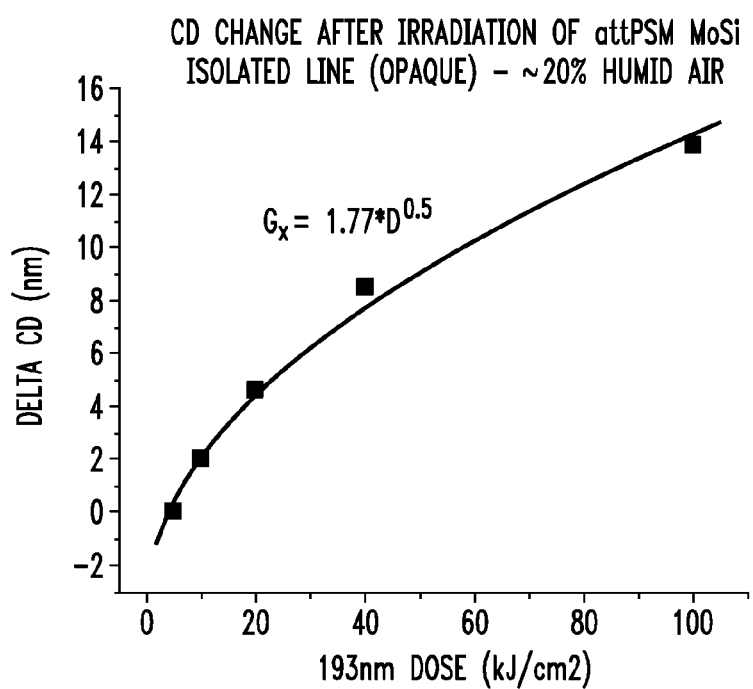
FIG. 9 shows exemplary growth versus exposure dose for attenuated molybdenum silicide absorber.

For the attenuated molybdenum silicide absorber under identical conditions, we have found that K is approximately 1.77 as shown in FIG. 9. FIG. 9 depicts growth versus exposure dose for attenuated molybdenum silicide absorber. The squares are the measured data, and the line is a least squares fit following the functional dependence of equation 1.

Note that the data presented in FIGS. 8 and 9 shows that the constant K depends on the absorber material. Attenuated molybdenum silicide exhibits nearly 2.5 times the growth of the OMOG molybdenum silicide under identical conditions.

Figure 10:
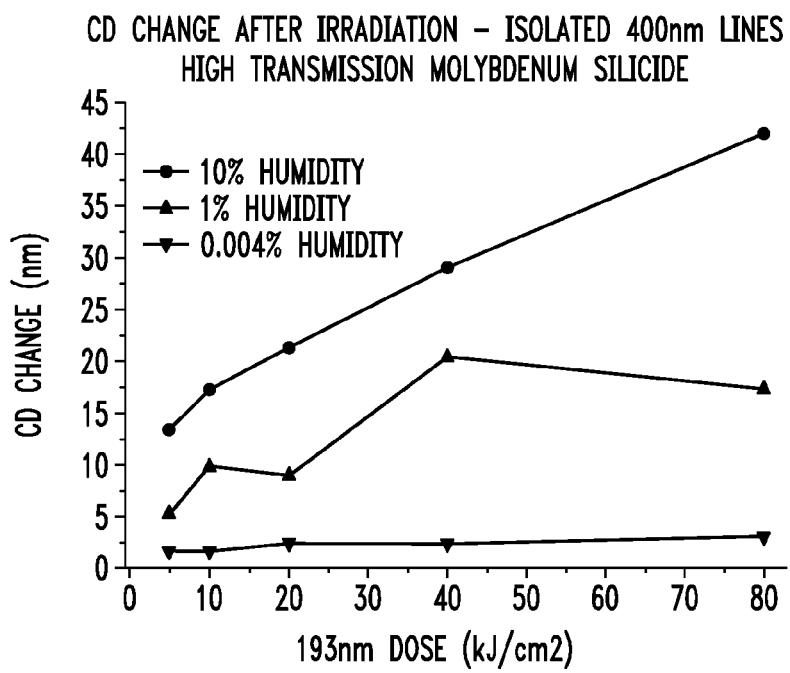
FIG. 10 shows exemplary growth versus exposure dose for a high transmission molybdenum silicide absorber at several values of relative humidity.

The constant K also depends on the composition of the gaseous environment surrounding the photomask. For a high transmission molybdenum silicide photomask (Hoya A152, Hoya Corporation, Tokyo, Japan), we have observed the dependence of growth on relative humidity as shown in FIG. 10, which presents growth versus exposure dose for high transmission molybdenum silicide absorber at a relative humidity of 0.004, 1, and 10%. As the relative humidity increases, the growth rate also increases. In this case, the constant K increases from less than 0.1 to approximately 5 as the humidity is increased from 0.004% to 10%. Since K is a function of both absorber composition and relative humidity, we can express K as:

$$K = c \cdot H^a \quad (2)$$

where:
c is a constant dependent on the absorber material,
H is the relative humidity of the gas (e.g., air) surrounding the photomask under appropriate conditions (e.g., at standard temperature and pressure (STP)), and
a is an exponent typically in the range of 0.1 to 1.

Figure 11:
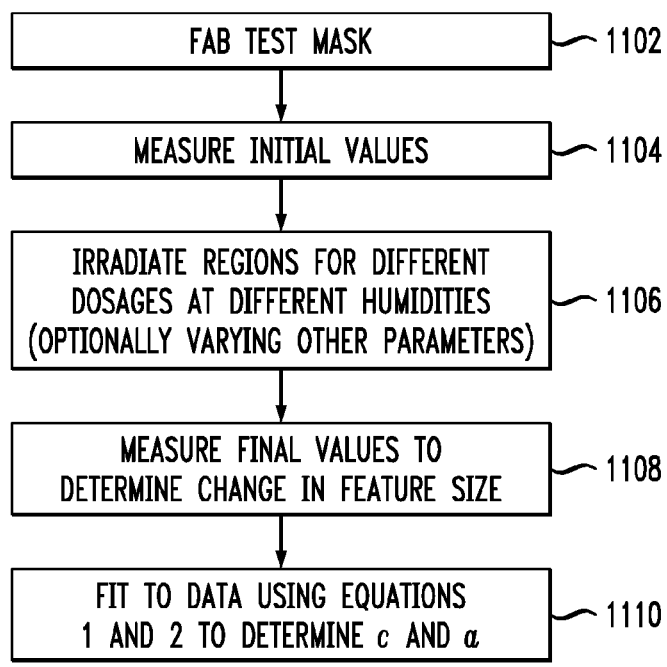
FIG. 11 presents a flow chart for determining required humidity, according to another aspect of the invention.

An exemplary procedure for determine c and a is now described with regard to FIG. 11. A photomask is fabricated from the desired (molybdenum) silicide absorber, such that the photomask contains lines and spaces repeated across the photomask, as in step 1102. These lines and spaces are precisely measured at several sites on the photomask, in 1104. In step 1106, a series of regions on the photomask are then irradiated with progressively larger doses of photons at a wavelength of 193 nm, the doses ranging from 0 to approximately 100 kJ/cm². This series of photon doses are repeated in several regions at a series of humidity values, ranging from approximately 0.1% to 10% relative humidity. The features on the photomask are re-measured in step 1108, and change in feature size for each irradiated area is determined. A fit to the data, such as a least squares fit, using equations 1 and 2, is performed in step 1110, thus determining the constants c and a.

This characterization is performed for each photomask material, thus allowing the change in feature size to be predicted based on absorber material, radiation dose, and relative humidity. A similar procedure can be followed to determine the dependence of growth on oxygen concentration.

Selection of Appropriate Humidity Values

While ideally, a relative humidity of zero is desirable to minimize growth of the absorber (in cases when minimizing growth is the goal), a practical value can be estimated dependent on the use of the photomask. Advanced photomasks are typically required to achieve a mean feature size which is within 3 nm of a target value. Therefore, during use in a lithography stepper, feature growth due to oxidation of the molybdenum silicide should be limited to no more than 3 nm over the desired use life of the photomask. For high volume manufacturers of integrated circuits (e.g. memory and microprocessors), a photomask may be used for 100,000 or more wafer prints. This corresponds to a total 193 nm exposure dose of approximately 50 kJ/cm² or more at the photomask. Similarly for a low volume manufacturer of integrated circuits (e.g. ASICs), a photomask may be used for only 1000 wafer prints or less, corresponding to a 193 nm exposure dose of 0.5 kJ/cm² or less. By using equations 1 and 2, and the desired total exposure dose (D) for the lifetime of the photomask, an estimate of the acceptable relative humidity for the particular molybdenum silicide absorber can be made.

Considerations When Growth is Desired

Where it is desired to deliberately cause growth in the absorber layer, it may typically be desirable to cause such growth as fast as possible, such that in theory, pure oxygen saturated with water vapor is preferred. However, this might cause trouble with oxidation of the equipment, or be expensive. Thus, in a non-limiting example, one might employ clean air with a relative humidity of at least about 10%, and preferably at least about 20%, up to about 40 or 50% or more. (Upper values beyond about 40 or 50% may lead to oxidation of the chamber or other equipment. In one or more embodiments, oxidation of the silicide, such as molybdenum silicide, is induced to alter the size of features by immersing the photomask in an oxidizing environment (e.g. an environment containing OH, $H_2O_2$, pure oxygen, $O_3$, etc. This can be produced in a plasma of oxygen and/or water vapor, in addition to (for example, 193 nm) light exposure in the presence of water vapor and/or oxygen, and by other suitable techniques.

By way of summary, review, and provision of detail, in one or more embodiments, the environment is controlled, for example, using an ECS of a standard stepper apparatus, to prevent undesirable growth. This may be done, for example, using a standard stepper modified to control humidity or provide a vacuum or inert gas environment.

Figure 12:
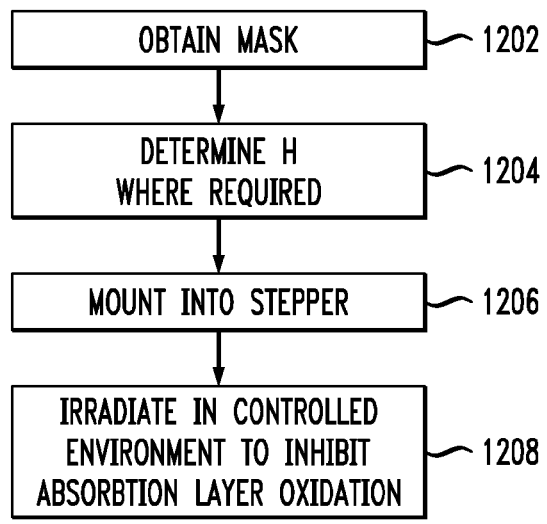
FIG. 12 presents a flow chart for inhibiting oxidation, according to yet another aspect of the invention.

With reference to FIG. 12, an exemplary method includes step 1202, obtaining a photomask comprising a light transmitting substrate and an absorber layer adjacent thereto. The absorber layer comprises a silicide patterned into a plurality of features. Optional step 1204 is discussed below. Step 1206 includes mounting the photomask into a stepper apparatus for use in an integrated circuit fabrication process. Step 1208 includes, during the integrated circuit fabrication process, irradiating the photomask with radiation of less than about 240 nm in wavelength in a controlled environment, whereby growth of the absorber layer by oxidation is substantially inhibited. In one or more embodiments, the controlled environment is an atmosphere comprising a substantially dry inert gas, such as substantially dry argon, substantially dry nitrogen, substantially dry helium, substantially dry neon, substantially dry xenon, and the like. It should be noted that the examples herein are presented in terms of molybdenum silicide, but the techniques set forth herein are generally applicable to silicides. "Substantially dry" means having a sufficiently low fraction of water vapor such that a desired lifetime can be obtained. Techniques presented elsewhere herein for moist air can be adapted for use with these other gases.

In another aspect, the controlled environment is a vacuum environment. The vacuum environment should comprise a low enough pressure (high enough vacuum) such that a desired lifetime can be obtained. Techniques presented elsewhere herein for moist air can be adapted for use in determining how low a pressure (how high a vacuum) will be needed under different conditions for different gases. The vacuum environment can be, for example, an ambient pressure of no more than about ten percent of standard atmospheric pressure, or preferably an ambient pressure of no more than about one percent of standard atmospheric pressure. Standard temperature and pressure may be taken as 20° C. (293.15 K, 68° F.) and an absolute pressure of 101.325 kPa (14.696 psi).

In yet another aspect, the controlled environment is air with a controlled humidity and the mask has a required lifetime. In such a case, step 1204 is performed. Step 1204 includes taking into account the effect of ambient humidity on oxidation of the absorber layer during the integrated circuit fabrication process over the required lifetime, to obtain a humidity value consistent with the required lifetime. The step of taking this into account can include determining applicable values of c and a (for example, as described elsewhere herein), and using equations 1 and 2 to obtain a value of H consistent with the required lifetime. A further reduction in growth of the absorber layer can be achieved by eliminating oxygen, in addition to water vapor, from the ambient surrounding the photomask. This can be achieved by immersing the photomask in an inert gas environment, for example dry helium, neon, argon, xenon, or nitrogen, or by immersing the photomask in vacuum, as described above. In general, the permissible humidity values for the inert gases will be determined similarly to those for air.

Figure 13:
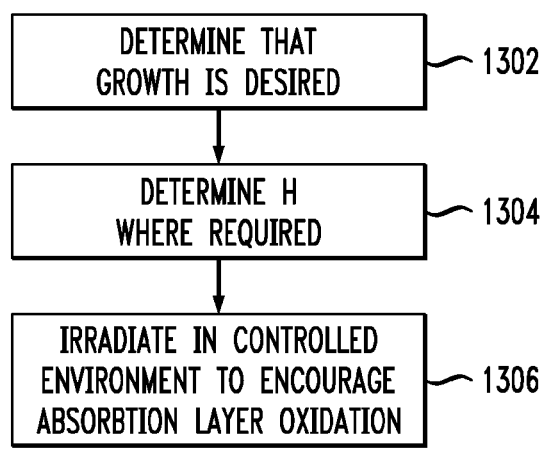
FIG. 13 presents a flow chart for encouraging oxidation, according to still another aspect of the invention.

With reference to FIG. 13, an exemplary method, where growth is desired, includes, as at step 1302, determining that, for a photomask comprising a light transmitting substrate and an absorber layer adjacent thereto, the absorber layer comprising a silicide patterned into a plurality of features, it is desirable to cause growth of the absorber layer to change a size of at least one of the plurality of features. Optional step 1304 is discussed below. Step 1306 includes, responsive to the determining, irradiating at least a portion of the photomask adjacent the at least one of the plurality of features with radiation of less than about 240 nm in wavelength in presence of an oxidizing environment, to cause the growth of the absorber layer with concomitant change of the size of the at least one of the plurality of features.

The oxidizing environment can include one or more of hydrogen peroxide, hydroxide, substantially pure oxygen, ozone, and water vapor. The irradiating step 1306 can be carried out locally (e.g., portion 606 described above) to cause change of a subset of the features. In other instances, the irradiating step 1306 is carried out across substantially an entire surface of the photomask 604 to cause change of substantially all the features.

In some instances, the oxidizing environment comprises moist air having a relative humidity value, H, sufficient to cause the growth in a desired time under an available radiation power density. H is determined in step 1304, by determining c and a (for example, as described elsewhere herein) and applying equations 1 and 2.

The oxidizing environment can be produced in a number of ways in addition to the methods described above; for example, an electrical discharge in the presence of $O_2$ and water vapor can be used to produce ozone (an ozone generator).

The techniques set forth herein can be used in the fabrication of integrated circuit chips. The chip design can be created, for example, in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design can then be converted into an appropriate format such as, for example, Graphic Design System II (GDSII), for the fabrication of photolithographic masks, which typically include multiple copies of the chip design in question that are to be formed on a wafer. The photolithographic masks can be utilized to define areas of the wafer (and/or the layers thereon) to be etched or otherwise processed.

Resulting integrated circuit chips can be distributed by the fabricator in raw wafer form (that is, as a single wafer that has multiple unpackaged chips), as a bare die or in a packaged form. In the latter case, the chip can be mounted in a single chip package (such as a plastic carrier, with leads that are affixed to a mother board or other higher level carrier) or in a multi-chip package (such as a ceramic carrier that has either or both surface interconnections or buried interconnections). In any case, the chip may then be integrated with other chips, discrete circuit elements and/or other signal processing devices as part of either (a) an intermediate product, such as a mother board, or (b) an end product. The end product can be any product that includes integrated circuit chips, ranging from toys and other low-end or consumer electronic applications to advanced computer products having a display, a keyboard or other input device, and a central processor.

Exemplary System and Article of Manufacture Details

A variety of techniques, utilizing dedicated hardware, general purpose processors, firmware, software, or a combination of the foregoing may be employed to implement the present invention or components thereof. One or more embodiments of the invention, or elements thereof, can be implemented in the form of a computer product including a tangible computer usable storage medium with computer usable program code for performing the method steps indicated. Furthermore, one or more embodiments of the invention, or elements thereof, can be implemented in the form of an apparatus including a memory and at least one processor that is coupled to the memory and operative to perform exemplary method steps.

Figure 7:
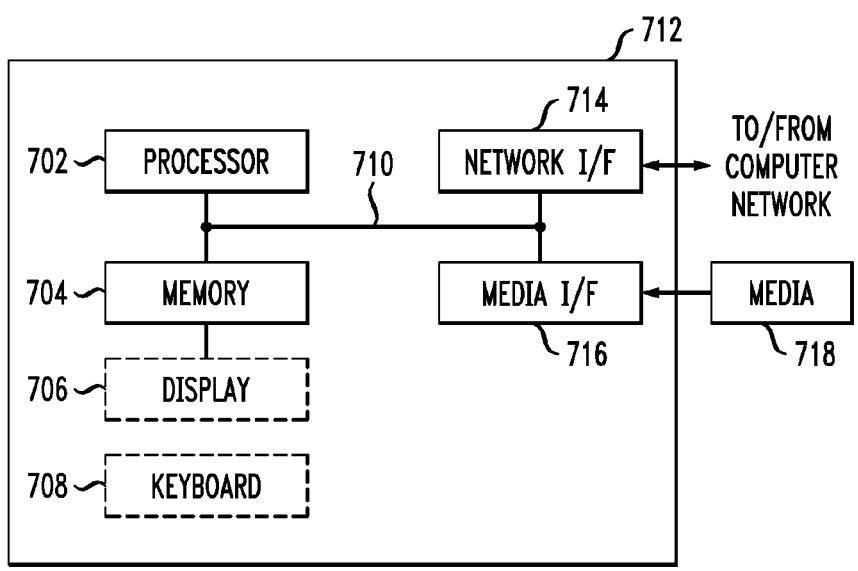
FIG. 7 depicts a computer system that may be useful in implementing one or more aspects and/or elements of the invention.

One or more embodiments can make use of software running on a general purpose computer or workstation (for example, to control ECS 150 or ECS 612; calculate H, c and/or a, and so on). With reference to FIG. 7, such an implementation might employ, for example, a processor 702, a memory 704, and an input/output interface formed, for example, by a display 706 and a keyboard 708. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 702, memory 704, and input/output interface such as display 706 and keyboard 708 can be interconnected, for example, via bus 710 as part of a data processing unit 712. Suitable interconnections, for example via bus 710, can also be provided to a network interface 714, such as a network card, which can be provided to interface with a computer network, and to a media interface 716, such as a diskette or CD-ROM drive, which can be provided to interface with media 718. Feedback needed to control ECS 150 or ECS 612 could be provided over network interface 714 or via a direct connection such as a Universal Serial Bus (USB) port or the like.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and executed by a CPU. Such software could include, but is not limited to, firmware, resident software, microcode, and the like.

Furthermore, the invention can take the form of a computer program product accessible from a computer-usable or computer-readable medium (for example, media 718) providing program code for use by or in connection with a computer or any instruction execution system. For the purposes of this description, a computer usable or computer readable medium can be any apparatus for use by or in connection with the instruction execution system, apparatus, or device. The medium can store program code to execute one or more method steps set forth herein.

A computer-usable or computer-readable medium can, in general, be an electronic, magnetic, optical, electromagnetic, infrared, or semiconductor system (or apparatus or device) or a propagation medium. Examples of a tangible computer-readable storage medium, as opposed to a propagation medium or a signal per se, include a semiconductor or solid-state memory (for example memory 704), magnetic tape, a removable computer diskette (for example media 718), a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor 702 coupled directly or indirectly to memory elements 704 through a system bus 710. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards 708, displays 706, pointing devices, humidity sensors, temperature sensors, and the like) can be coupled to the system either directly (such as via bus 710) or through intervening I/O controllers (omitted for clarity).

Network adapters such as network interface 714 may also be coupled to the system to enable the data processing system to become coupled to other data processing systems or remote printers or storage devices through intervening private or public networks. Modems, cable modem and Ethernet cards are just a few of the currently available types of network adapters.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Embodiments of the invention have been described herein with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a tangible, computer-readable storage medium that can direct a computer or other programmable data processing apparatus to function in a particular manner, such that the instructions stored in the tangible computer-readable storage medium produce an article of manufacture including instruction means which implement the function/act specified in the flowchart and/or block diagram block or blocks. The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In any case, it should be understood that the components illustrated herein may be implemented in various forms of hardware, software, or combinations thereof, for example, application specific integrated circuit(s) (ASICS), functional circuitry, one or more appropriately programmed general purpose digital computers with associated memory, and the like. Given the teachings of the invention provided herein, one of ordinary skill in the related art will be able to contemplate other implementations of the components of the invention.

It will be appreciated and should be understood that the exemplary embodiments of the invention described above can be implemented in a number of different fashions. Given the teachings of the invention provided herein, one of ordinary skill in the related art will be able to contemplate other implementations of the invention. Indeed, although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method comprising the steps of:
obtaining a photomask comprising a light transmitting substrate and an absorber layer adjacent thereto, said absorber layer comprising a silicide patterned into a plurality of features;
mounting said photomask into a stepper apparatus for use in an integrated circuit fabrication process; and
during said integrated circuit fabrication process, irradiating said photomask with radiation of less than about 240 nm in wavelength in an atmosphere comprising a substantially dry inert gas and a substantial absence of water vapor;
whereby growth of said absorber layer by oxidation is substantially inhibited.

2. The method of claim 1, wherein said silicide comprises molybdenum silicide.

3. The method of claim 2, wherein said substantially dry inert gas comprises substantially dry argon.

4. The method of claim 2, wherein said substantially dry inert gas comprises substantially dry nitrogen.

5. A method comprising the steps of:
obtaining a photomask comprising a light transmitting substrate and an absorber layer adjacent thereto, said absorber layer comprising a silicide patterned into a plurality of features;
mounting said photomask into a stepper apparatus for use in an integrated circuit fabrication process;
during said integrated circuit fabrication process, irradiating said photomask with radiation of greater than about 100 nm and less than about 240 nm in wavelength in a vacuum environment having a substantial absence of water vapor;
whereby growth of said absorber layer by photo-chemistry induced oxidation is substantially inhibited.

6. The method of claim 5, wherein said silicide comprises molybdenum silicide.

7. The method of claim 6, wherein said vacuum environment comprises an ambient pressure of no more than about ten percent of standard atmospheric pressure.

8. The method of claim 6, wherein said vacuum environment comprises an ambient pressure of no more than about one percent of standard atmospheric pressure.

9. A method comprising the steps of:
obtaining a photomask for use in an integrated circuit fabrication process, said photomask comprising a light transmitting substrate and an absorber layer adjacent thereto, said absorber layer comprising a silicide patterned into a plurality of features, said photomask having a required lifetime;
taking into account an effect of ambient humidity on oxidation of said absorber layer during said integrated circuit fabrication process over said required lifetime, to obtain a humidity value consistent with said required lifetime, wherein taking into account comprises irradiating a plurality of regions on at least one test photomask substantially similar to said photomask for use in said integrated circuit fabrication process with progressively larger doses of photons, and repeating the progressively larger doses at a plurality of test ambient humidity values;
mounting said photomask into a stepper apparatus for use in said integrated circuit fabrication process; and
during said integrated circuit fabrication process, irradiating said photomask with radiation of less than about 240 nm in wavelength in an environment consistent with said humidity value;

whereby growth of said absorber layer by oxidation is substantially inhibited to aid in achieving said required lifetime.

10. The method of claim 9, wherein said silicide comprises molybdenum silicide.

11. The method of claim 10, wherein said step of taking into account comprises:
determining applicable values of (i) a constant, c, dependent on a material of said absorber layer, and (ii) an exponent, a; and
applying a first equation and a second equation to obtain said humidity value, H, consistent with said required lifetime,
said first equation being:

$$G=K*\sqrt{D}$$

where:
G is allowable increase in feature size due to growth of said absorber layer by oxidation during said required lifetime,
K is a constant dependent on absorber material and gas composition, and
D is total exposure dose in energy per unit area during said required lifetime,
said second equation being:

$$K=c*H^a$$

12. The method of claim 11, wherein said step of determining said applicable values comprises:
measuring growth of sets of features on the at least one test photomask for the plurality of progressively larger doses per unit area and the plurality of test ambient humidity values, to obtain a data set; and
carrying out a curve fit to said data set, using said first and second equations, to determine said applicable values of c and a.

13. A method comprising the steps of:
determining that, for a photomask comprising a light transmitting substrate and an absorber layer adjacent thereto, said absorber layer comprising a silicide patterned into a plurality of features, it is desirable to cause growth of said absorber layer to change a size of at least one of said plurality of features to a target size;
responsive to said determining, irradiating at least a portion of said photomask adjacent said at least one of said plurality of features with radiation of less than about 240 nm in wavelength in presence of an oxidizing environment from a laser beam of a broadband laser, to cause said growth of said absorber layer with concomitant change of said size of said at least one of said plurality of features to substantially conform to said target size.

14. The method of claim 13, wherein said silicide comprises molybdenum silicide.

15. The method of claim 14, wherein said oxidizing environment comprises hydrogen peroxide.

16. The method of claim 14, wherein said oxidizing environment comprises hydroxide.

17. The method of claim 14, wherein said oxidizing environment comprises substantially pure oxygen.

18. The method of claim 14, wherein said oxidizing environment comprises ozone.

19. The method of claim 14, wherein said oxidizing environment comprises water vapor.

20. The method of claim 14, wherein said irradiating step is carried out locally to cause change of a subset of said features by focusing the laser beam to a particular area of the photomask.

21. The method of claim 14, wherein said irradiating step is carried out by applying the laser beam across substantially an entire surface of said photomask to cause change of substantially all said features.

22. The method of claim 14, wherein said oxidizing environment comprises moist air having a relative humidity value, H, sufficient to cause said growth in a desired time under an available radiation power density.

23. The method of claim 22, further comprising the additional step of determining H by:
determining applicable values of (i) a constant, c, dependent on a material of said absorber layer, and (ii) an exponent, a; and
applying a first equation and a second equation, said first equation being:

$$G=K*\sqrt{D}$$

where:
G is desired increase in feature size due to growth of said absorber layer by oxidation during said desired time,
K is a constant dependent on absorber material and gas composition, and
D is total exposure dose in energy per unit area during said desired time,
said second equation being:

$$K=c*H^a$$

24. The method of claim 23, wherein said step of determining said applicable values comprises:
measuring growth of sets of features on at least one test photomask substantially similar to said photomask for which it is desired to cause said growth, for a plurality of test energy doses per unit area and a plurality of test ambient humidity values, to obtain a data set; and
carrying out a curve fit to said data set, using said first and second equations, to determine said applicable values of c and a.

* * * * *